United States Patent [19]

Gissel

[11] Patent Number: 5,654,650

[45] Date of Patent: Aug. 5, 1997

[54] HIGH THROUGHPUT FPGA CONTROL INTERFACE

[75] Inventor: David W. Gissel, Colorado Springs, Colo.

[73] Assignee: Hewlett-Packard Company, Palo Alto, Calif.

[21] Appl. No.: 570,040

[22] Filed: Dec. 11, 1995

[51] Int. Cl.$^6$ ............................................. H03K 19/173
[52] U.S. Cl. ........................... 326/38; 326/9; 326/39
[58] Field of Search .............................. 326/38–41, 14, 326/9

[56] References Cited

U.S. PATENT DOCUMENTS

| | | | |
|---|---|---|---|
| 4,020,469 | 4/1977 | Manning et al. | 340/172.5 |
| 4,855,954 | 8/1989 | Turner et al. | 326/39 |
| 4,870,302 | 9/1989 | Freeman | 326/41 |
| 5,336,951 | 8/1994 | Josephson et al. | 326/38 |
| 5,394,031 | 2/1995 | Britton et al. | 326/38 |
| 5,493,239 | 2/1996 | Zlotnick | 326/38 |

*Primary Examiner*—Edward P. Westin
*Assistant Examiner*—Jon Santamauro

[57] ABSTRACT

A programmable logic device (PLD) including a plurality of programmable tiles organized in blocks. Each block comprises a unique subset of the plurality of programmable tiles. A data bus extends to each of the blocks. An independent address circuit is provided for each block. A block enable line is coupled to each block such that when the block enable is line is asserted the address circuit of a selected block is capable of transferring data from the data bus to the plurality of programmable tiles and when the block enable line is deasserted the data bus is substantially electrically isolated from the address circuit and data bus.

15 Claims, 8 Drawing Sheets

HIGH THROUGHPUT FPGA CONTROL INTERFACE

BACKGROUND OF THE INVENTION

1. Related Applications

This application is related to copending application Ser. No. 08/570,035 filed on Dec. 11, 1995, assigned to the assignee of the present invention.

2. Field of the Invention

The present invention relates, in general, to programable logic devices including field programable gate arrays (FPGAs), and, more particularly, to an apparatus and method for loading data streams used to program or configure FPGAs and for decreasing the amount of space needed to implement the FPGA control circuitry.

3. Statement of the Problem

Programmable logic devices (PLDs) include programable logic arrays (PLAs), field programmable gate arrays (FPGAs) and the like. In PLDs, configurable interconnects are used to connect logic elements, which may themselves be programmable, to each other and to input and output ports. To implement a desired circuit, PLDs must be given the information as to what connections are to be made and/or what logic is to be implemented by each of the logic elements. This is accomplished by applying a "configuration data stream" which is an ordered data stream in which each bit is represented by a binary value, to "configuration lines" formed on the PLD.

The configuration data stream is used to program individual switches inside the PLD to a desired state (i.e., on or off). These switches can be implemented from SRAM cells that control pass transistors, antifuse connection points, fuse connection points, or any other equivalent switch implementation. The programmed switches are used to control the configurable routing and logic of the PLD. In addition, the switches may form a RAM look-up table in FPGA's to implement combinational logic.

A typical PLD may comprise hundreds of programmable switches to accept and hold the configuration data stream. A continuing trend is to increase the logic capabilities of PLDs thereby increasing the number of programmable switches. Some devices employ thousands and tens of thousands of switches per PLD. These switches logically resemble a large addressable memory system with each switch uniquely identified by a column and row address.

In prior PLDs, all of the switches were arranged as a single array. A long shift register containing one bit for each column of switches in the array was used to hold the configuration data for a particular row. A second long shift register was used to load information as to which row in the array the data in the first shift register was to be loaded. Once both shift registers were loaded, all switches in a selected row could be programmed simultaneously by enabling the data in the first shift register to transfer into the programmable switches of the selected row.

Address lines must extend from the first and second shift registers across the entire array of switches in the prior configuration system. Also, each bit of both of the long shift registers must function or it may be impossible to load configuration data into the PLD. A fault in any of the long address lines could propagate backward or forward to other devices, rendering the entire chip non-functional.

In a high density PLD design it is desirable to minimize the physical space required for the control circuitry used to configure the PLD. By minimizing space required for control circuitry, more programmable elements can be added to the device increasing its functionality. At the same time, it is desirable to maximize the data throughput. In particular, when a device is tested and characterized, it is necessary to apply a wide variety of data streams in order to verify functionality of as many circuits as possible.

One prior solution is to provide a single serial interface to apply configuration data to the array of switches in the PLD. This has the advantage of minimizing the space required because only one serial data line needed to be routed through the device. However, a serial interface is too slow for large PLDs.

A second prior solution is to use a parallel external interface that accepts many lines of configuration data. The parallel configuration data is then converted to serial form within the PLD by a parallel-to-serial converter. This solution increased data throughput, however, increased circuit and interface complexity. Also, some space penalty exists because the parallel-to-serial converter circuitry is formed on the PLD chip.

U.S. Pat. No. 5,394,031 issued to Britton et al. on Feb. 28, 1995 describes a method for decreasing the amount of time required to configure an FPGA by allowing data to be loaded in parallel into a shift register. The shift register is configured to shift multiple bits per clock cycle. This solution is similar to the second solution identified above, but uses the on-chip shift register to perform the parallel to serial conversion.

A need exists for a methodology for reducing the time to configure an FPGA using an apparatus that minimizes the physical space required to implement the methodology.

SUMMARY OF THE INVENTION

Briefly stated, the above problems are overcome by a programmable logic device (PLD) having an external interface comprising a plurality of serial channels for simultaneously receiving a plurality of serial configuration data streams. In a preferred implementation, the PLD includes a plurality of programmable tiles organized in logical blocks. Each logical block comprises a unique subset of the plurality of programmable tiles. A multi-channel serial data bus extends to each of the blocks. Optionally, the programmable blocks of the PLD are organized into sets of blocks and a selector circuit routes the multichannel serial data bus to selected ones of the sets of blocks. In accordance with the present invention, a plurality of logical blocks are simultaneously coupled to the multichannel serial data bus to simultaneously receive unique configuration data streams.

The present invention also provides a method for loading configuration data into a programmable logic device (PLD) having a plurality of storage devices. The plurality of storage devices are organized into logical blocks. A plurality of logical blocks of the PLD are simultaneously enabled. Each of the enabled logical blocks are simultaneously connected to a unique data channel where each unique data channel provides a serial configuration data stream. Selected storage devices within the plurality of enabled blocks are addressed. A portion of the serial configuration data stream is loaded into the addressed storage devices.

DETAILED DESCRIPTION OF THE DRAWING

1. Overview

Figure 1:
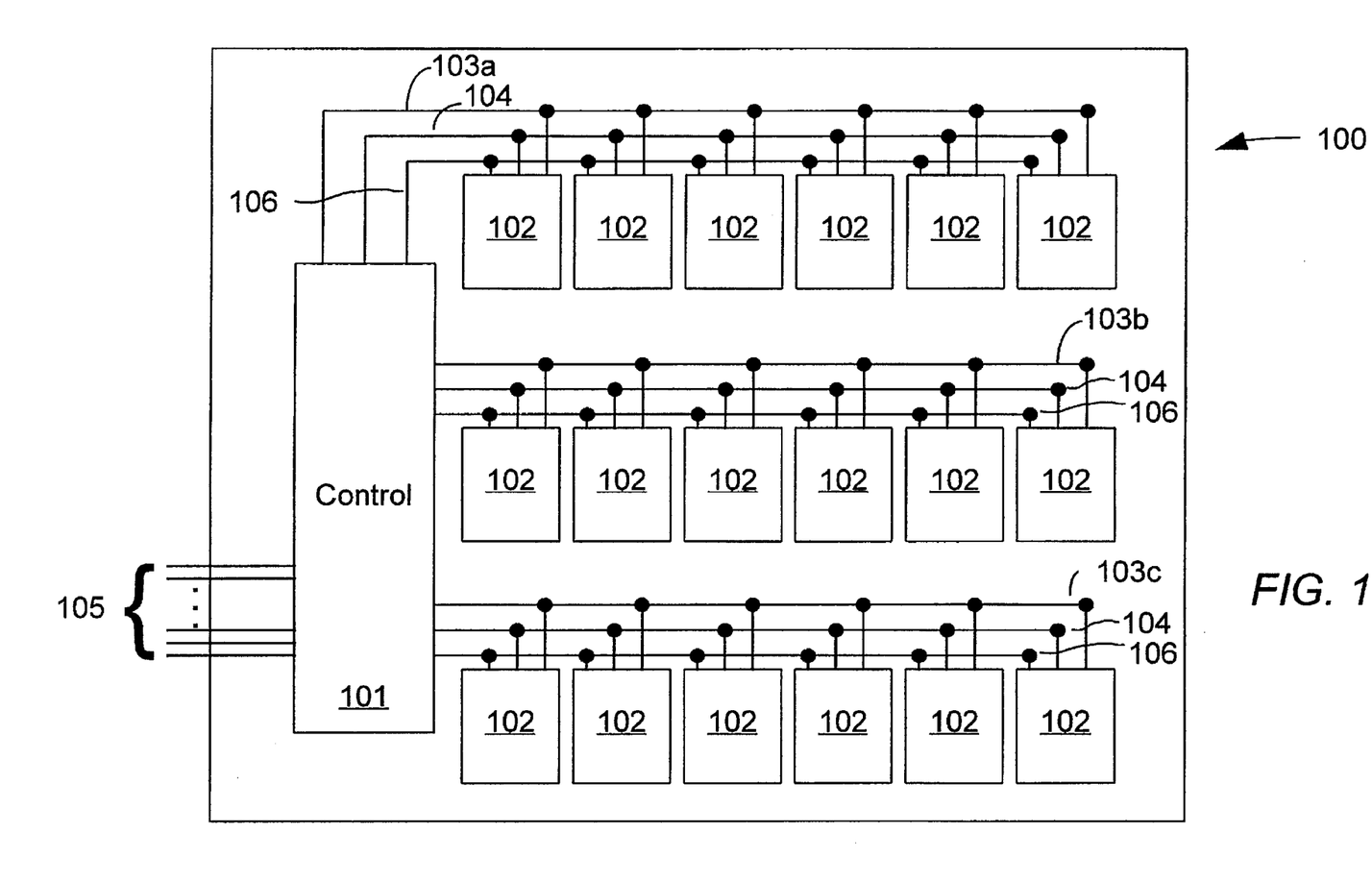
FIG. 1 shows a programmable logic device in accordance with the present invention in block diagram form.

FIG. 1 illustrates one embodiment of a PLD 100 in accordance with the present invention. PLD 100 includes a control circuit 101 and a plurality of substantially identical logical blocks 102. Control logic 101 serves general control functions such as clock generation and conducting communication between PLD 100 and external devices through I/O port 105. Control logic 101 in accordance with the present invention provides at least three types of outputs to logic blocks 102. Data bus 103a, data bus 103b and data bus 103c each comprise a plurality of wires carrying data used to configure logic blocks 102. Clock bus 104 carries clock information and may comprise one or more wires providing clock signals to logical blocks 102. Enable bus 106 provides enable data to each of blocks 102 allowing the logical blocks 102 to be individually addressed.

An important feature of the present invention is that logical blocks 102 are substantially identical, but substantially electrically independent. By electrically independent it is meant that should one block of the blocks 102 fail due to a defect, the remaining logical blocks can still be configured and function normally. To do this, a failed logical block 102 must not electrically load data bus 103a–103c, clock bus 104, or enable bus 106.

Each of logical blocks 102 comprise a plurality of programmable logical elements (not shown) and/or programmable interconnections (not shown) for coupling the elements. The programmable elements and programmable interconnections include a plurality of storage devices, for example SRAM cells (such as SRAM cell 701 shown in FIG. 7). The programmable elements, hence the storage devices, are arranged in an array such that each of the storage devices can be identified by a unique row and column address in the array. In this sense the array of switches is analogous to a memory array.

In the prior art, logical blocks 102 were configured as a single array of switches. In contrast, each of logical blocks 102 are substantially smaller than the entire chip and are similar but independent. Hence, in accordance with the present invention each programmable logic block 102 can be configured simultaneously by receiving a single wire from the multi-wire data bus 103a–103c.

Figure 2:
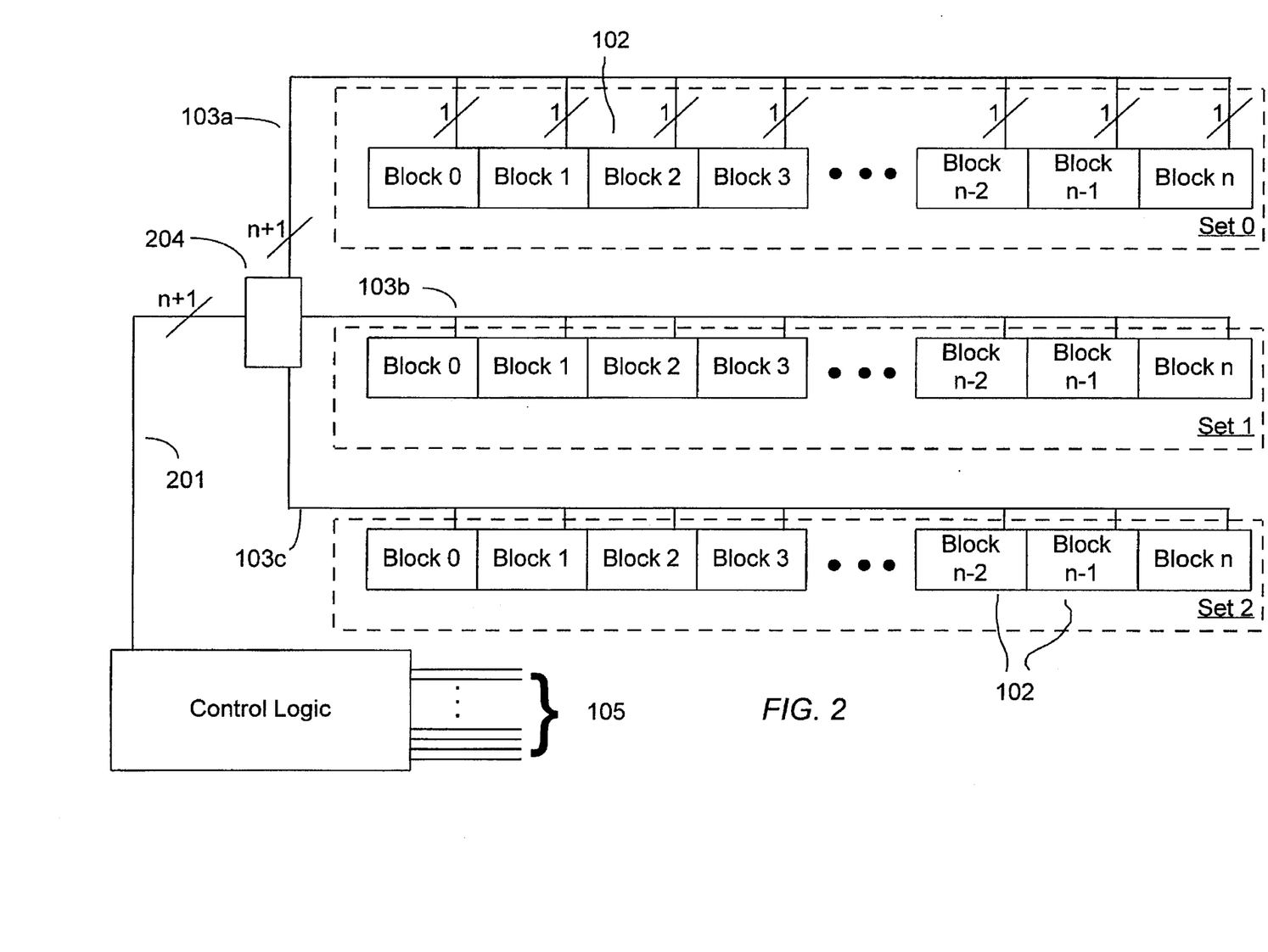
FIG. 2 shows another programmable logic device in accordance with the present invention in block diagram form.

FIG. 2 shows an alternative view of PLD 100 in accordance with the present invention. To aid understanding, logic blocks 102 are labeled BLOCK 0 through BLOCK n in FIG. 2. To allow illustration of the routing of multichannel data bus 103a–103c in greater detail, clock bus 104 and enable bus 106 are not shown in FIG. 2, as these are routed to each logic block (i.e., Block 0 through Block n) in the manner described for FIG. 1.

As shown in FIG. 2, logical blocks 102 are arranged into three sets of blocks indicated by dashed line boxes labeled Set 0, Set 1, and Set 2. Each set comprises n+1 logical blocks 102 (i.e., blocks 0–n). Any number of sets of logical blocks can be provided, and any number of logical blocks 102 within each set can be provided. Preferably, each set is substantially identical in contents in that each set comprises the same number n+1 of logical blocks 102.

Block 0 through Block n of Set 0 are coupled to multichannel data bus 103a. Block 0 through Block n of Set 1 are coupled to multichannel data bus 103b. Block 0 through Block n of Set 2 are coupled to multichannel data bus 103c. Each multichannel data bus 103a, 103b, and 103c are coupled through multichannel data bus 201 to control logic 101 Selector circuit 204 serves to select either data bus 103a or data bus 103b or data bus 103c for coupling to data bus 201.

As best illustrated in Set 0, each block 102 in Set 0 is coupled by a single line to multiwire data bus 103a. In this manner, Block 0 through Block n are each coupled to independent channels of multichannel data bus 103a. Hence, each block 102 can be loaded with configuration data independently yet simultaneously for high throughput.

It should be understood that PLD 100 could be configured with a single set of logical blocks 102 in which case selector 204 would not be necessary. Also, a selector similar to selector 204 may be used to route clock bus 104 and enable bus 106 to selected sets of logic blocks. These are design choices made to meet the needs of a particular application.

2. Block Selector Circuit

Figure 3:
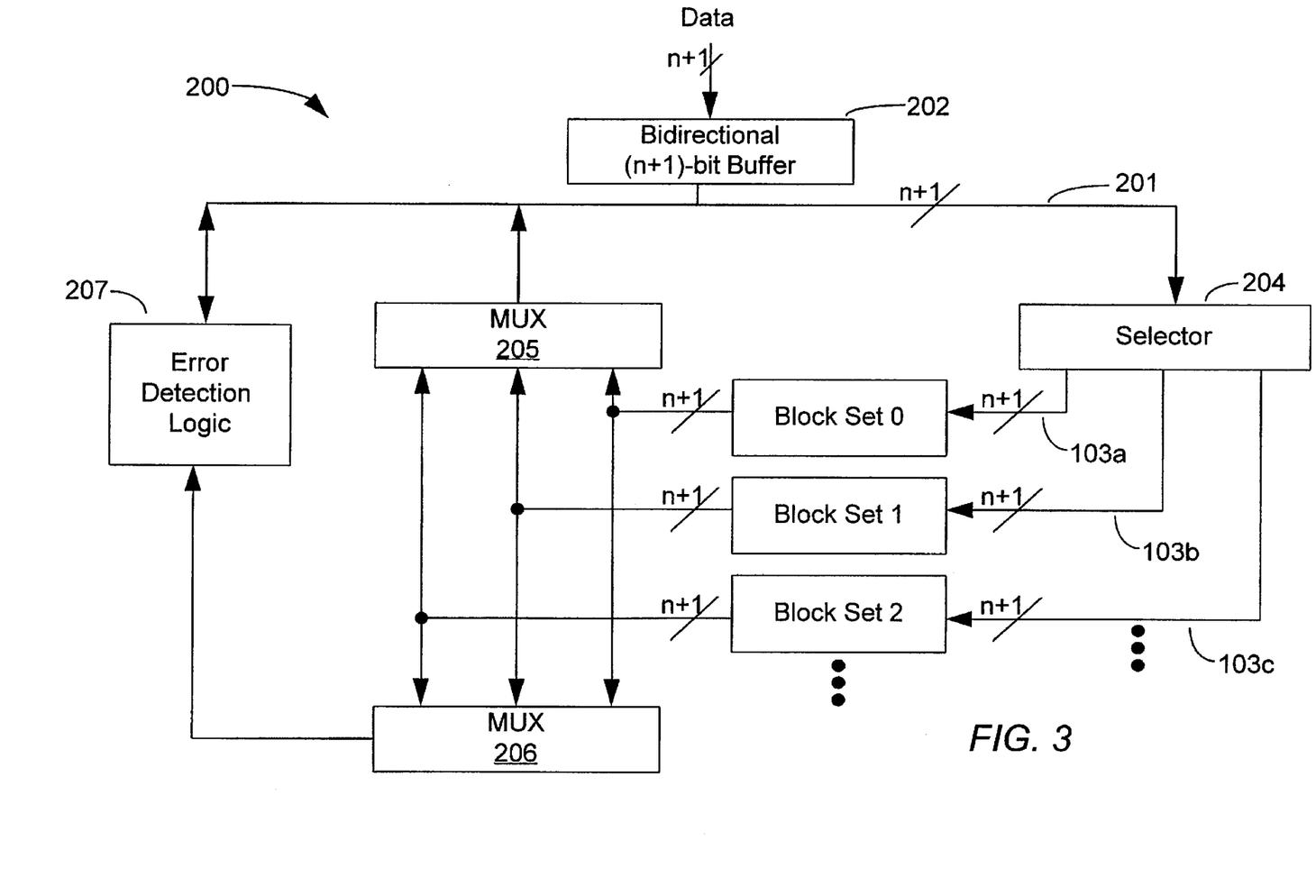
FIG. 3 shows detail of a block selector circuit in accordance with the present invention.

FIG. 3 illustrates a block selector circuit in accordance with the present invention. Data line 201 is coupled directly or indirectly to I/O port 105 (shown in FIG. 2) through bi-directional n-bit buffer 202. Bi-directional buffer 202 stores, conditions, and synchronizes data bits. The number of parallel bits received (n) can be as few as 2 and as many as the number of data wires in I/O port 105. Data bus 201 is a bi-directional bus which can accept data from bi-directional buffer 202 or input data into bi-directional buffer 202.

Selector 204 couples to data bus 201 as described in reference to FIG. 2. Selector 204 directs the n+1 wires of data bus 201 to n+1 lines of one of Set 0, Set 1, or Set 2 of programmable blocks using multichannel data bus 103a, 103b or 103c respectively. Each set includes n+1 blocks as shown in FIG. 2. For example, assuming the number of data lines in internal data bus 103 is eight, selector 204 serves to direct eight data lines to Block 0 through Block 7 of Block Set 0. One data line is coupled to Block 0 and one is coupled to Block 1. The remaining six data lines are coupled to unique blocks in a similar manner. Hence, blocks 102 are loaded simultaneously using each data line as a separate channel. In this manner, each block in independently configurable, however programming time is reduced because multiple blocks can be configured simultaneously. This takes full advantage of a wide data bus that is most likely otherwise provided on PLD 100 while still achieving the advantages of the present invention including segmented block architecture.

In another aspect of the present invention, each of Set 0, Set 1, and Set 2 of logical blocks 102 are coupled to multiplexor 205. Multiplexor 205 can select data coming from one of logical blocks 102 and provide that data back to data bus 201. In this manner, data loaded into logical blocks 102 can be loaded out via multiplexor 205 through bi-directional buffer 202 to external circuitry for evaluation or confirmation via data bus 201. This bi-directional use of internal data bus 201 reduces the number of wires required and increases functionality of the control circuit 101 shown in FIG. 1.

Another feature that may be implemented in accordance with the present invention is coupling Set 0, Set 1, and Set 2 of logic blocks 102 to multiplexor 206. Multiplexor 206 selects one set of logical blocks 102 and couples the selected set to error detection logic 207. Error detection logic 207 is also coupled to multichannel data bus 201. In this manner, as data is loaded via data bus 201 to one or more of logic blocks 102 it can be taken from the logic block after it is loaded and routed to error detection logic 207. Error detection logic 207 functions to compare data actually loaded into blocks 102 with reference data loaded from data bus 201. Should a discrepancy exist in the data loaded into the programmable logic blocks 102, an error signal is generated. Upon generation of an error signal, the faulty logic block can be further analyzed using the data output through multiplexor 205, or it can be permanently deselected by block selector 204 such that the faulty block is no longer available for use.

3. Logical Block Architecture

Figure 4:
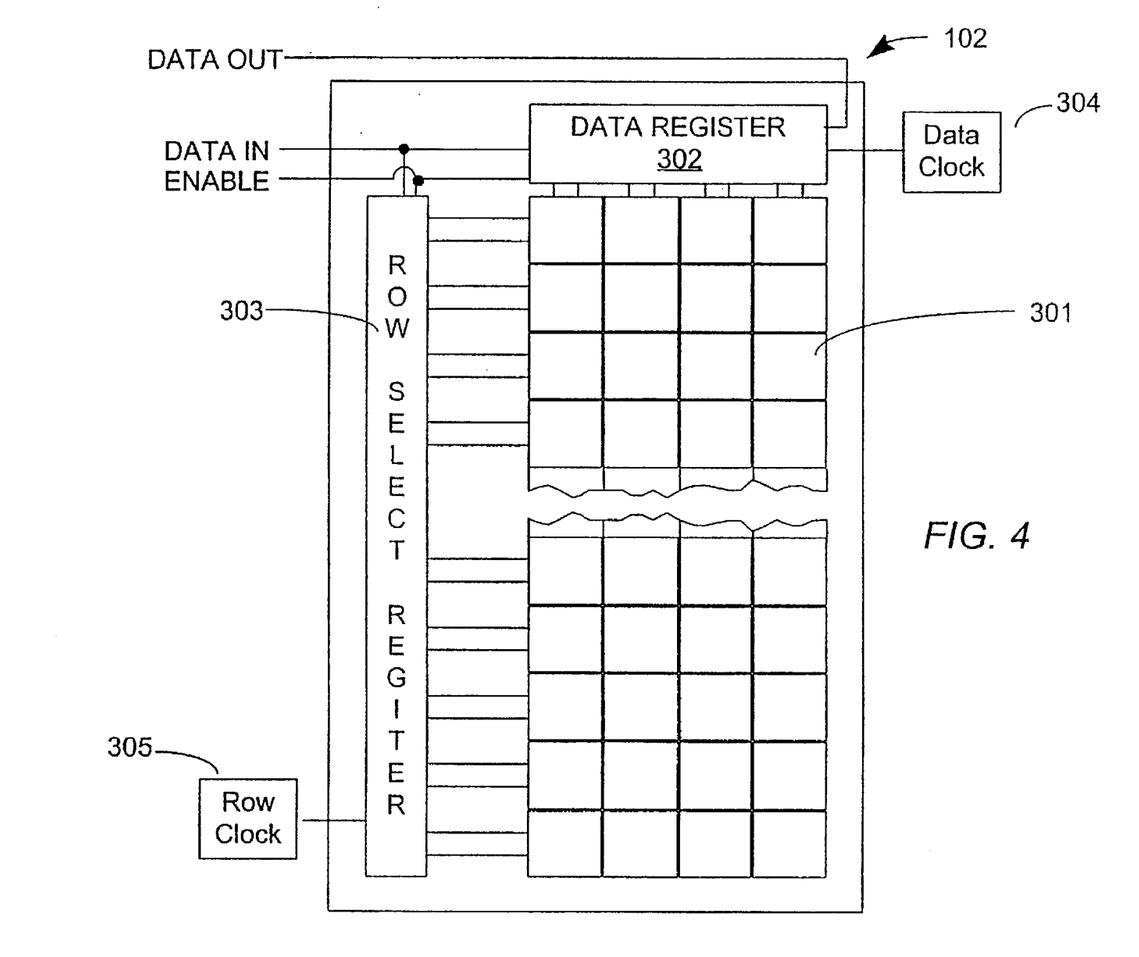
FIG. 4 shows detail of a preferred embodiment logic block of the PLD shown in FIG. 1 in block diagram form.

FIG. 4 shows a block diagram of an example logic block structure in accordance with the present invention. For purposes of illustration, only logic block 102 is shown, however, it should be understood that each of logic blocks 102 shown in FIG. 1 and FIG. 2 are substantially identical. Importantly, logic block 102 accepts only four inputs. In the preferred embodiment, the line labeled "DATA IN" comprises one or more data lines coupled to the internal data bus 103 shown in FIG. 2. Significantly, the number of lines in the DATA IN line can be as few as one and as many as the number of wires in multichannel data bus 103.

The enable input to logic block 102 is generated by block selector 204 shown in FIG. 2. Bit clock 304 and row clock 305 are generated by control logic 101 and supplied via clock bus 106 shown in FIG. 1. A data register 302 is coupled to the DATA IN line and bit clock 304. Upon receiving signal from data clock 304, data register 302 loads data from the DATA IN line. One or more than one bit of data may be loaded each cycle of bit clock 304 depending on the particular architecture.

Similarly row select register 303 is coupled to the DATA IN line and row clock 305. Data is loaded in and responds to pulses or signal on ROW CLOCK 305 from the DATA IN line. Row select register 303 may load data one bit at a time, or multiple bits at a time depending on the architecture used.

Programmable block 102 comprises a plurality of programmable logic elements or tiles 301. Each logic element or tile 301 comprises programmable combinational logic and associated programmable interconnect circuitry. In a preferred embodiment, programmable tiles 301 are arranged in an array in a row and column fashion. Each programmable element or tile 301 includes a number of storage devices used to program the combinational logic and interconnects. In a particular example, each programmable element 301 comprises approximately 100 storage devices.

Each of the storage devices in the array of programmable elements 301 is individually addressable or uniquely identified within the programmable logic block 102 by its row address (selected by Row select register 303), column location (selected by data register 302). Data address lines (shown in FIG. 4) extend from data register 302 extend across all of the logic elements 301 within block 102. Similarly, row select address lines (shown in FIG. 4) extend from row select register 303 across all of the logic elements 301 within block 102.

An important advantage in accordance with the present invention is that the address lines extending from data buffer 302 and row select register 303 do not have to extend beyond or outside of the physical boundaries of programmable block 102. This greatly reduces the number of wires that must extend across the entire width of PLD 100 (shown in FIG. 1). In a preferred embodiment the DATA IN line is a single wire. In this way, only four lines (i.e., bit clock 304, row clock 305, data in, and enable) enter each programmable block 102. Hence, only these four wires need to extend across the entire width of PLD 100 (shown in FIG. 1). This great reduction in the number of lines extending across the entire chip 100 increases reliability and tolerance to defects significantly. Further, considering that bit clock 304 and row clock 305 are shared among many programmable logic blocks 102 it can be seen that the present invention provides a great reduction in the number of wires that must extend across the entire chip.

Figure 5:
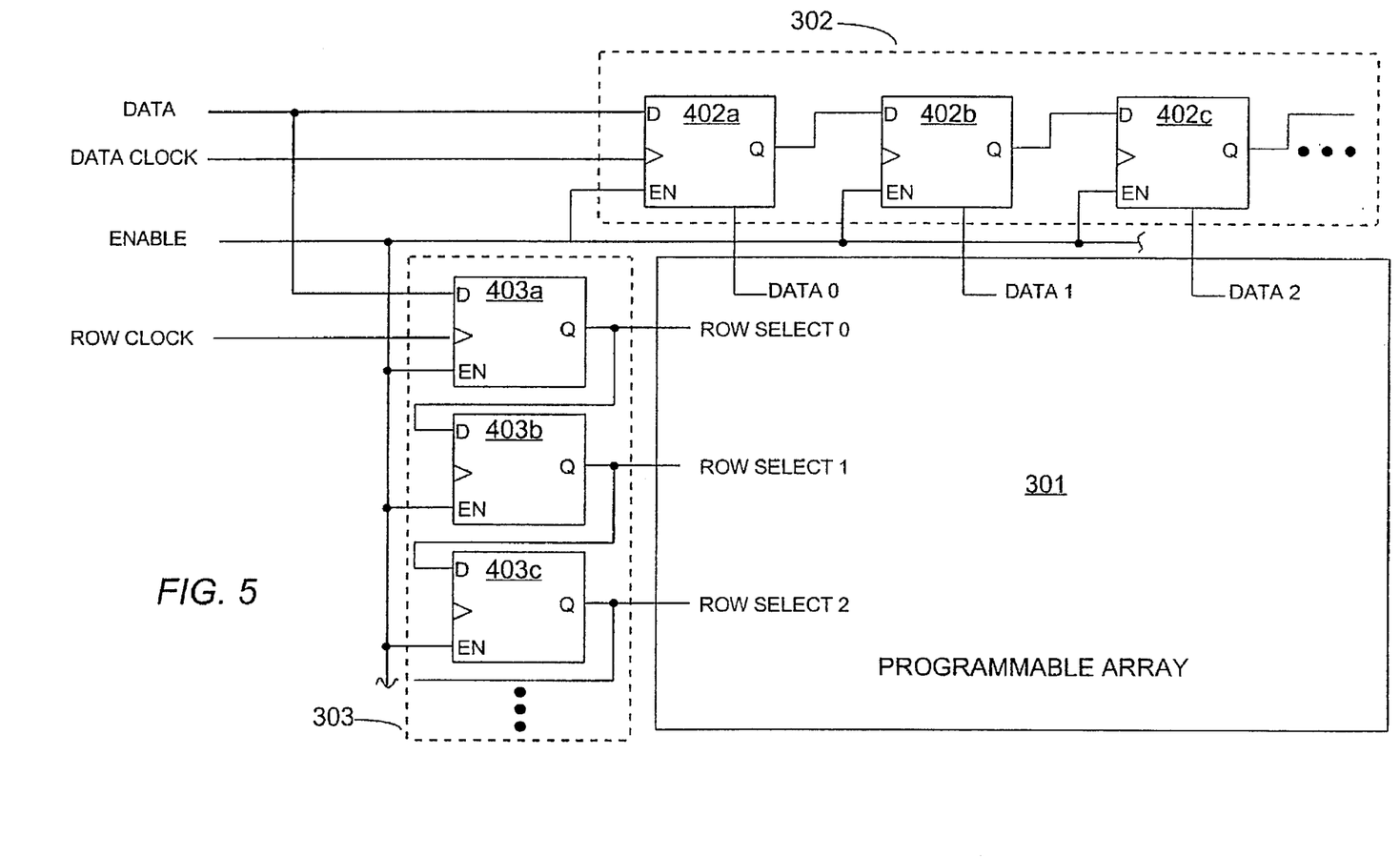
FIG. 5 shows the logic block of FIG. 3 in greater detail.

FIG. 5 illustrates in greater detail a portion of the preferred logic block 102a shown in FIG. 4. Programmable array 301 comprises an array of programmable storage devices that are individually or uniquely identified by ROW SELECT and DATA lines. Data register 302 is configured as a shift register comprising a plurality of serially connected flip-flops 402a, 402b, and 402c, etc. Data register 302 can be any length. In a preferred embodiment, a single data line is coupled to the D input of first flip-flop 402a. DATA CLOCK line is connected to the clock input of each of flip-flops 402a–402c, although for ease of illustration only a single connection is shown. The ENABLE line couples to the enable inputs (labeled EN in FIG. 5) of each of flip-flops 402a–402c. In operation, block 102a is enabled by assertion of the ENABLE line before data is loaded into data register 302. Hence, with each pulse of the BIT CLOCK line one bit of information is shifted through data buffer 302.

Row select register 303 is implemented using serially connected flip-flops 403a–403c. Any number of flip-flops may be used to create row select register 303. Each flip-flop has a clock input coupled to the ROW CLOCK line and each flip-flop generates one ROW SELECT address line. All the flip-flops 403a–403c are coupled in parallel to the ENABLE line. Hence, when the ENABLE line is asserted, both data buffer 302 and row select register 303 are enabled. During this enabled cycle, each time data clock 304 cycles, data is loaded from the DATA line into data register 302. Each time the row clock 305 cycles, data is loaded from the DATA line serially into row select register 303.

Data buffer 302 and row select register 303 may be loaded in any order. Upon completion of loading data buffer 302 and row select register 303 the data appearing on the data address lines DATA 0–DATA 2 in FIG. 4 is stored in the storage elements uniquely identified by the row address lines ROW SELECT 0–ROW SELECT 2. In this manner, programmable array 301 is configured to perform a particular operation. Data can be read from programmable array 301 in a similar manner using data register 302 and row select register 303 in a manner familiar to those with the design of read/write memory arrays.

4. Method of Operation

Figure 6:
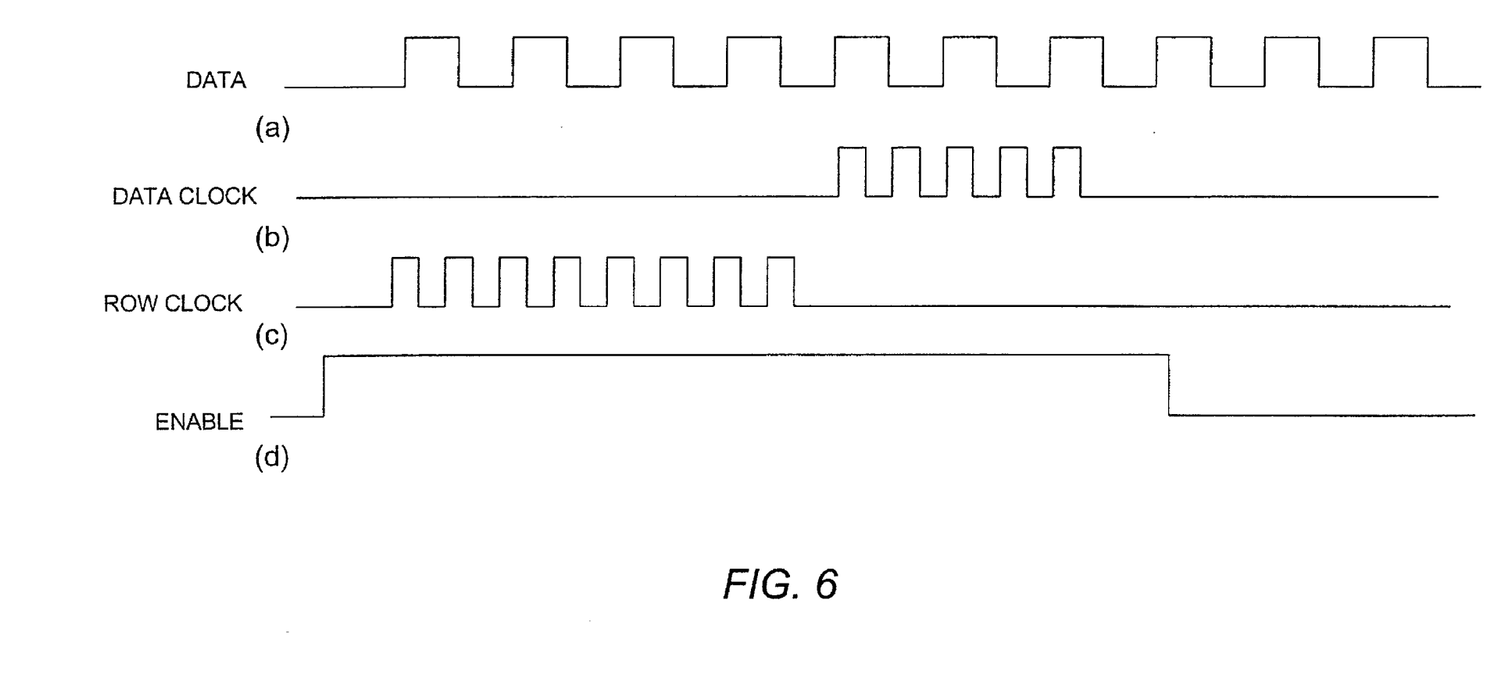
FIG. 6 shows a timing diagram useful in operating the PLD of the preferred embodiment.

FIG. 6 illustrates a timing diagram for the four signals entering block 102 shown in FIG. 4 and FIG. 5. For ease of description, the DATA signal illustrated comprises alternating logic 1's and logic 0's, although it should be understood that a practical data stream would comprise information particularly tailored for the circuit to be implemented in programmable array 301. Data clock 304 (shown in FIG. 4) issues one pulse for each bit in the width of data register 302. That is to say, one pulse for each shift register 402a–402c that forms data buffer 302. In FIG. 6, five pulses are issued indicating a shift register with five bits. In practical circuits, shift register 302 will be tens or hundreds of bits wide.

Similarly, row clock 305 issues a pulse for each bit in the length of row select register 303. Although only eight pulses are shown, practical circuits would employ row select registers having tens or hundreds of bits. As indicated in FIG. 6, the ENABLE line is asserted before data arrives and before data clock 304 and row clock 305 are activated. In FIG. 6, the bit clock is activated before the row clock, however, it should be understood that the bit clock pulses and row clock pulses can come in any order so long as the data appearing on the DATA line is valid during the particular clock cycle.

Figure 7:
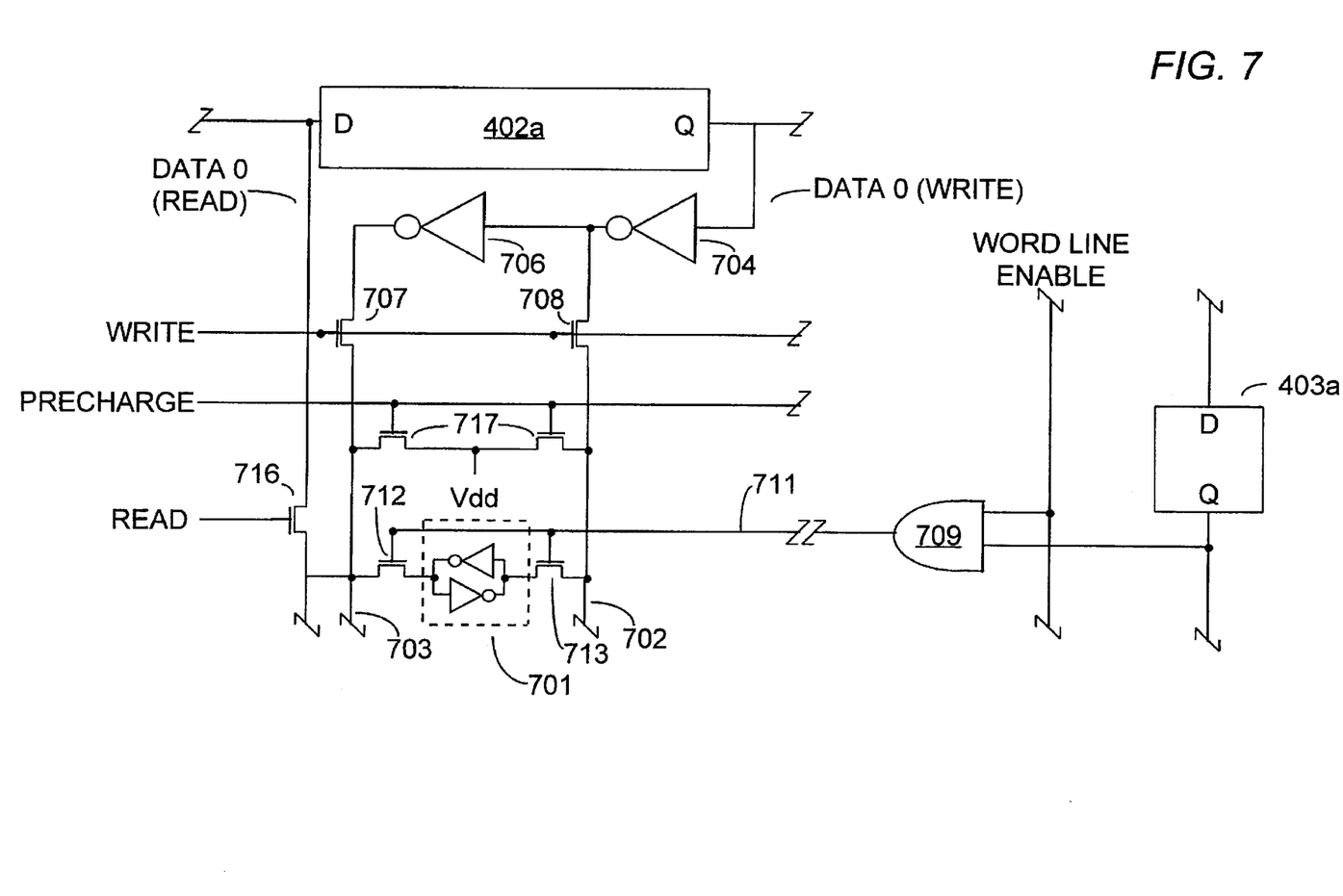
FIG. 7 illustrates a portion of a preferred logic block of FIG. 5 in greater detail.
Figure 8:
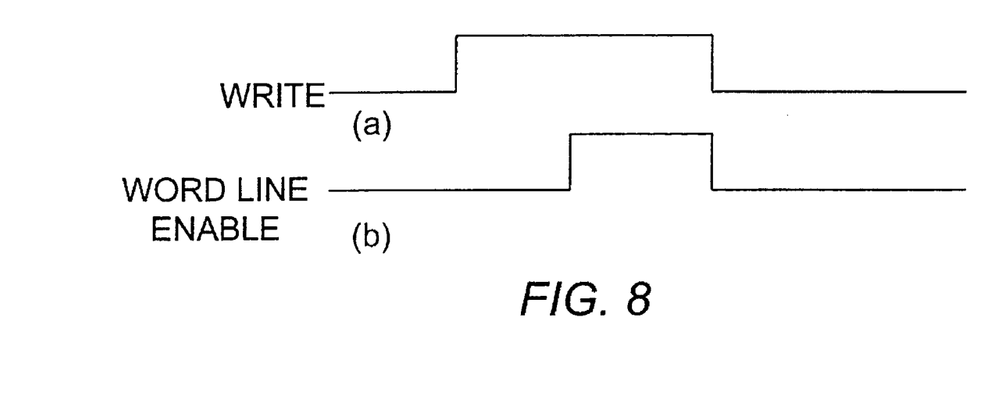
FIG. 8 and FIG. 9 show timing diagrams for control signals provided to the logic block of FIG. 7.
Figure 9:
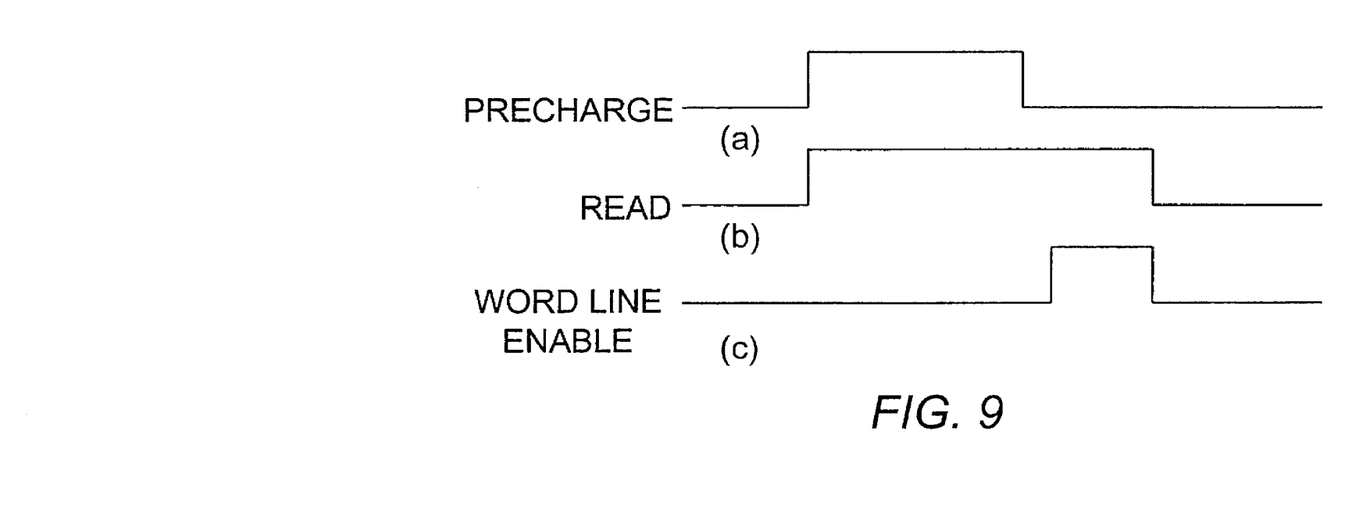

The preferred method of operation is best understood with reference to FIG. 7, FIG. 8, and FIG. 9. FIG. 7 illustrates detailed control lines used in a preferred embodiment to program a SRAM cells such as SRAM cell 701. Although a single SRAM cell 701 is shown, it should be understood that the control circuitry shown in FIG. 7 is shared among many SRAM cells as described hereinbefore. To ease understanding, control circuitry such as clock lines and block enable lines that have already been discussed are not included in FIG. 7, however, it is understood that these elements are used in a practical circuit as described hereinbefore.

SRAM cell 701 stores one bit of data that is programably couple to non-inverting bit line 703 and inverting bit line 702. Data is written to SRAM cell 701 by driving bit lines 702 and 703 appropriately and activating programmable switches as set out in greater detail below. The stored data bit is read from SRAM cell 701 by coupling the reading circuitry to the non-inverted bit line 702.

In FIG. 7, a single flip-flop 402a (also shown in FIG. 5) of data register 302 is illustrated. Flip-flop 402 is loaded with one bit of data in the manner described with reference to FIG. 5 and FIG. 6. Also shown in FIG. 7 is a single flip flop 403a of row register 303. For purposes of illustration, it is assumed that flip-flop 403a contains a logic HIGH signal meaning that the row of which SRAM cell 701 is a part is currently addressed. The Q output of flip-flop 403a is coupled to one input of AND gate 709.

A non-inverted Q output of flip-flop 402a is coupled through inverter 704 and write transistor 708 to inverted bit line 702. The output of inverter 704 is also coupled through a second inverter 706 and write transistor 707 to the non-inverted bit line 703. During a write transaction, the WRITE control line is asserted to make write transistors 707 and 708 conductive. After the write control line is asserted, valid data is present on the bit lines 702 and 703.

Data is transferred from the bit lines 702 and 703 to SRAM cell 701 by assertion of a signal on word line 711. When the WORD LINE ENABLE control signal is asserted to a second data input of AND gate 709, word line 711 becomes a logic HIGH when addressed by flip flop 403a. In this manner, all of the SRAM cells 701 in a row of SRAM cells are simultaneously coupled to their respective bit lines 702 and 703. The relative timing of the WRITE control signal and the WORD LINE ENABLE signal are illustrated in the timing diagram of FIG. 8.

Preferably, data can also be read from SRAM cell 701 into flip-flop 402a. This functionality is provided by coupling the D input of flip-flop 402a through read transistor 716 to bit line 703. Alternatively, the inverted bit line 702 could be used so long as appropriate adjustments were made for signal polarity. During a read operation, assertion of a logic HIGH signal on word line 711 and a logic HIGH signal on read transistor 716 (in the manner discussed above) results in a transfer of data from SRAM cell 710 to flip flop 402a.

Optionally, the circuit is provided with precharge capability to improve performance. Precharge transistors 711 have one current carrying electrode coupled to the logic high power supply Vdd. Precharge transistors 711 each have the other of their current carrying electrodes coupled to one Of bit lines 702 and 703. During a operation, assertion of the PRECHARGE signal makes both precharge transistors 711 conductive charging bit lines 702 and 703 to a preselected voltage. In the example shown in FIG. 7, the preselected voltage is Vdd. As shown in FIG. 9, the READ signal can be simultaneously applied to transistor 716 with the PRECHARGE signal. After a preselected time the voltage on bit lines 702 and 703 stabilizes and PRECHARGE can be deasserted. Subsequently, word line 711 is asserted causing bit lines 702 and 703 to take on a logic state determined by the bit stored in SRAM cell 701. Once the data is captured by flip-flop 402a, the READ signal is deasserted and the READ cycle is complete.

The details of the write and read operations in accordance with the preferred embodiment are provided for completeness only, and are not considered limitations on the teachings of the present invention. Many functional designs are known for writing data to and reading data from a memory cell such as SRAM cell 701. These are equivalent to the specific method described herein.

By now it should be appreciated that a programmable logic device (PLD) having an external interface comprising a plurality of serial channels for simultaneously receiving a plurality of serial configuration data streams is provided. A plurality of programmable tiles is organized in logical blocks where each logical block comprises a unique subset of the plurality of programmable tiles. A multi-channel serial data bus extends to each of the blocks. A selector circuit is coupled to a block enable line of each block such that when the block enable is line is asserted the address circuit of a selected block is capable of transferring data from one of the channels in the multichannel serial data bus to the plurality of programmable tiles.

We claim:

1. A programable logic device (PLD) comprising:
    at least one control data port for receiving a plurality of serial configuration data channels from an external source;
    a control bus for routing the plurality of configuration data channels from the control data port;
    a plurality of programable blocks;
    a plurality of storage devices within each programable block for receiving and storing configuration data; and
    an address circuit within each programable block coupled to one channel of the control bus and coupled by address lines to each of the storage devices.

2. The PLD of claim 1 wherein failure of one of the programable blocks does not affect any other of the programmable blocks, the control bus, and the at least one control data port.

3. The PLD of claim 1 wherein the address circuit and at least one data line for each programmable block are electrically independent from the address circuit and at least one data line of each other programmable block.

4. The PLD of claim 1 wherein the storage devices are arranged as an array of N rows and M columns and the address circuit further comprises:
    an N-bit row register coupled to the at least one data line and having row lines extending only from the row register across the M columns;

an M-bit column register coupled to the at least one data line and having column lines extending from the column register only across the N-rows.

5. The PLD of claim 4 wherein the row register and column register are each coupled to at least two data lines and are loaded in parallel.

6. The PLD of claim 5 wherein the row register and column register are each coupled to only one data line and are loaded in serial.

7. A single chip programmable logic device (PLD) comprising:

a plurality of programmable tiles organized in blocks wherein each block comprises a unique subset of the plurality of programmable tiles;

a data bus extending to each of the blocks;

independent address means for each block, the address means coupled to the data bus;

an independent block enable line coupled to each block such that when the block enable line is asserted the address means of a selected block is capable of transferring data from the data bus to the plurality of programmable tiles and when the block enable line is deasserted the data bus is substantially electrically isolated from the address means, the assertion and deassertion of the block enable line coupled to each block being independent of the assertion and deassertion of any other block enable line wherein any combination of blocks in a row is enabled to receive said data.

8. A programmable device (PLD) comprising:

an array of switches;

a plurality of logical blocks, wherein each logical block comprises a unique subset of the array of switches, each switch uniquely identifiable by a row address, a column address, and a block address;

a block select bus for supplying the block address to selected ones of the array of switches;

a plurality of row select lines supplying the row address to selected ones of the array of switches; and a plurality of column lines supplying the column address to selected ones of the array of switches.

9. The programmable device (PLD) of claim 8 further comprising:

at least one data line coupled to each of the plurality of logical blocks for supplying a configuration data stream to the logical blocks;

a register in each logical block having a data input coupled to the at least one data line, an enable input coupled to the block select bus, and having outputs coupled to the row select lines, and the column lines.

10. The programmable device of claim 8 wherein the row select lines and column select lines are physically constrained in length to a single one of the plurality of logical blocks.

11. A single chip programmable logic device (PLD) having a plurality of programmable logic blocks formed integrally on the single chip, each programmable logic block comprising:

a plurality of storage devices for receiving and storing configuration data;

a select line for receiving a signal to enable the programmable logic block, said signal being independent of the operation of any other programmable logic block in said plurality of programmable logic blocks so that any combination of said plurality of programmable logic blocks in a row can be enabled;

at least one data line coupled to the plurality of storage devices for supplying configuration data; and an address circuit for enabling a selected number of the plurality of storage devices in the block to store configuration data from the at least one data line.

12. A programmable logic device (PLD) having a plurality of programmable logic blocks, each programmable logic block comprising:

a plurality of storage devices for receiving and storing configuration data;

a select line for receiving a signal to enable the programmable logic block;

at least one data line coupled to the plurality of storage devices for supplying configuration data; and an address circuit for enabling a selected number of the plurality of storage devices in the block to store configuration data from the at least one data line, wherein the address circuit comprises:

a first clock line;

a second clock line;

a first shift register having a data input coupled to the data line and having a first clock input and having an enable input coupled to the select line;

a plurality of address lines extending from each bit of the first shift register and terminating at the width of the programmable logic block;

a second shift register having a data input coupled to the data line and having a second clock input and having an enable input coupled to the select line;

a plurality of data lines extending from each bit of the second shift register and terminating at the length of the programmable logic block.

13. A programmable logic device (PLD) comprising:

a plurality of programmable tiles, each tile comprising plurality of programmable storage devices;

a plurality of logic blocks, wherein each logic block comprises a unique set of the programmable tiles;

a first clock line coupled to each logic block;

a second clock line coupled to each logic block;

a data line coupled to each logic block;

an enable line coupled to each logic block;

an address circuit within each logic block responsive to the first clock line, the second clock line, the data line, and the enable line, wherein the address circuit has a plurality of address lines extending only to each of the programmable tiles within the logic block, the address circuit capable of transferring data received from the data line to selected ones of the programmable logic elements within the block when a preselected signal is received on the enable line.

14. A method for loading a configuration data stream into a programmable logic device having a plurality of storage devices, the method comprising the steps of:

enabling at least one block of storage devices of the programmable logic device, the at least one block comprising less than all of the storage devices in the PLD;

addressing selected storage devices within the at least one selected block;

loading a portion of the configuration data stream into the addressed storage devices; and repeating the enabling, addressing, and loading steps until the configuration data stream is exhausted, wherein the step of addressing further comprises:

supplying a row address in the configuration data stream to enable a group of the selected storage devices;

supplying column data in the configuration data stream; and wherein the step of loading comprises transferring the column data to the group of the selected storage devices.

15. A method for loading a configuration data stream into a programmable logic device having a plurality of storage devices, the method comprising the steps of:

enabling at least one block of storage devices of the programmable logic device, the at least one block comprising less than all of the storage devices in the PLD;

addressing selected storage devices within the at least one selected block;

loading a portion of the configuration data stream into the addressed storage devices; and repeating the enabling, addressing, and loading steps until the configuration data stream is exhausted, wherein the enabling step comprises enabling more than one block of storage devices.

* * * * *